United States Patent
Huang et al.

(10) Patent No.: US 8,782,569 B1
(45) Date of Patent: Jul. 15, 2014

(54) METHOD FOR INSPECTING PHOTO-MASK

(71) Applicant: United Microelectronics Corp., Hsin-Chu (TW)

(72) Inventors: Chain-Ting Huang, Tainan (TW); Yung-Feng Cheng, Kaohsiung (TW); Ming-Jui Chen, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/802,868

(22) Filed: Mar. 14, 2013

(51) Int. Cl.
G06F 17/50 (2006.01)

(52) U.S. Cl.
USPC ............ 716/51; 716/52; 716/53; 716/54; 716/55

(58) Field of Classification Search
CPC ......... G06F 1/144; G06F 1/36; G06F 1/70; G06F 1/32; G06F 7/70441
USPC .................. 716/51, 52, 53, 54, 55
See application file for complete search history.

(56) References Cited

U.S. PATENT DOCUMENTS

| | | | |
|---|---|---|---|
| 6,433,878 | B1 | 8/2002 | Niu |
| 7,695,876 | B2 | 4/2010 | Ye |
| 2004/0119036 | A1 | 6/2004 | Ye |
| 2004/0190008 | A1 | 9/2004 | Mieher |
| 2005/0026050 | A1* | 2/2005 | Ozawa et al. ............... 430/5 |
| 2006/0062445 | A1* | 3/2006 | Verma et al. ............ 382/144 |
| 2006/0206851 | A1 | 9/2006 | Van Wingerden |
| 2011/0107280 | A1* | 5/2011 | Liu et al. ................. 716/53 |
| 2014/0019919 | A1* | 1/2014 | Tsai et al. ................ 716/53 |

* cited by examiner

Primary Examiner — Jack Chiang
Assistant Examiner — Brian Ngo
(74) Attorney, Agent, or Firm — Winston Hsu; Scott Margo

(57) ABSTRACT

An inspection method for a photo-mask in a semiconductor process is provided. First, a first photo-mask with a first wafer anchor point (1st wafer FAM) is provided. Then, $D_{max}$ and $D_{min}$ are calculated according to the 1st wafer FAM. A second photo-mask and a second mask anchor point (2nd mask FAM) of the second photo-mask are provided. A CD average, and a CD range of the second photo-mask are measured. Finally, the second photo-mask is inspected by using equation A and/or equation B:

CD average−2nd mask $FAM < D_{max} - CD$ range/2 (equation A)

2nd mask $FAM - CD$ average $< D_{min} - CD$ range/2 (equation B).

6 Claims, 5 Drawing Sheets

METHOD FOR INSPECTING PHOTO-MASK

BACKGROUND OF THE INVENTION

1. Field of the Invention

The present invention is related to a method for inspecting a photo-mask, and more particularly, to a method for inspecting a photo-mask focusing on the anchor point of the photo-mask.

2. Description of the Prior Art

In modern society, micro-processor systems composed of integrated circuits (IC) are ubiquitous devices, utilized in such diverse fields as automatic control electronics, mobile communication devices and personal computers. With the development of technology and the increasingly imaginative applications of electrical products, the IC devices become smaller, more delicate and more diversified.

In the semiconductor manufacturing processes, in order to transfer an integrated circuit layout onto a semiconductor wafer, the integrated circuit layout is first designed and formed as a photo-mask pattern. The photo-mask pattern is then proportionally transferred to a photoresist layer positioned on the semiconductor wafer. It is understood that the quality of the photo-mask may influence the critical dimension uniformity (CDU) of a wafer.

To ensure that the photo-mask can be successfully utilized in a lithography system, after the photo-mask is manufactured, an inspection process is usually carried out to check if there are defects on the photo-mask. The inspection process can ensure that the quality of the photo-mask can meet the target of the semiconductor manufacturing process. However, currently, there are no sufficient inspection methods that can help the manufacturers to maintain the quality of the photo-mask.

SUMMARY OF THE INVENTION

The present invention therefore provides a method for inspecting a photo-mask to ensure the quality of the photo-mask.

An inspection method for a photo-mask in a semiconductor process is provided. First, a first photo-mask with a first wafer anchor point (1st wafer FAM) is provided. Then, $D_{max}$ and $D_{min}$ are calculated according to the 1st wafer FAM. A second photo-mask with a second mask anchor point (2nd mask FAM) is provided. A CD average, and a CD range of the second photo-mask are measured. Finally, the second photo-mask is inspected by using equation A and equation B:

$$CD \text{ average} - 2nd \text{ mask } FAM < D_{max} - CD \text{ range}/2 \quad \text{(equation A)}$$

$$2nd \text{ mask } FAM - CD \text{ average} < D_{min} - CD \text{ range}/2 \quad \text{(equation B)}.$$

The present invention provides an inspection method for a photo-mask that concerns the CD average, the CD range and the mask FAM. The method is specifically beneficial since it can screen the unqualified photo-masks before they get on line.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be described in detail. The preferred embodiments of the present invention are illustrated in the accompanying drawings with numbered elements.

The present invention relates to an inspection method for a photo-mask. Parameters such as the critical dimension (CD) range, the CD average, the anchor point are used to inspect whether the photo-mask is qualified or not. In general, a photo-mask contains an anchor pattern, which is a special test pattern used to monitor the changes of the critical dimension on the photo-mask. In one embodiment, the anchor may be a "critical dimension bar (CD bar)" for example. When the photo-mask is used in a lithography process, a corresponding pattern will be formed on a substrate. The energy of the light source is adjusted until the line width of the corresponding pattern meets the desired value. Since then, the photo-mask will be used in the lithography process by using that fixed energy of light, so the formed patterns, including the anchor pattern, can be formed on the substrate with a desired CD. The line width of the anchor pattern on the photo-mask is therefore called "anchor point."

So far, there are few developments concerning the relationship between the CD range, the CD average and the anchor point. The present invention provides a method that constructs a relationship between those parameters so as to check a photo-mask.

Figure 1:
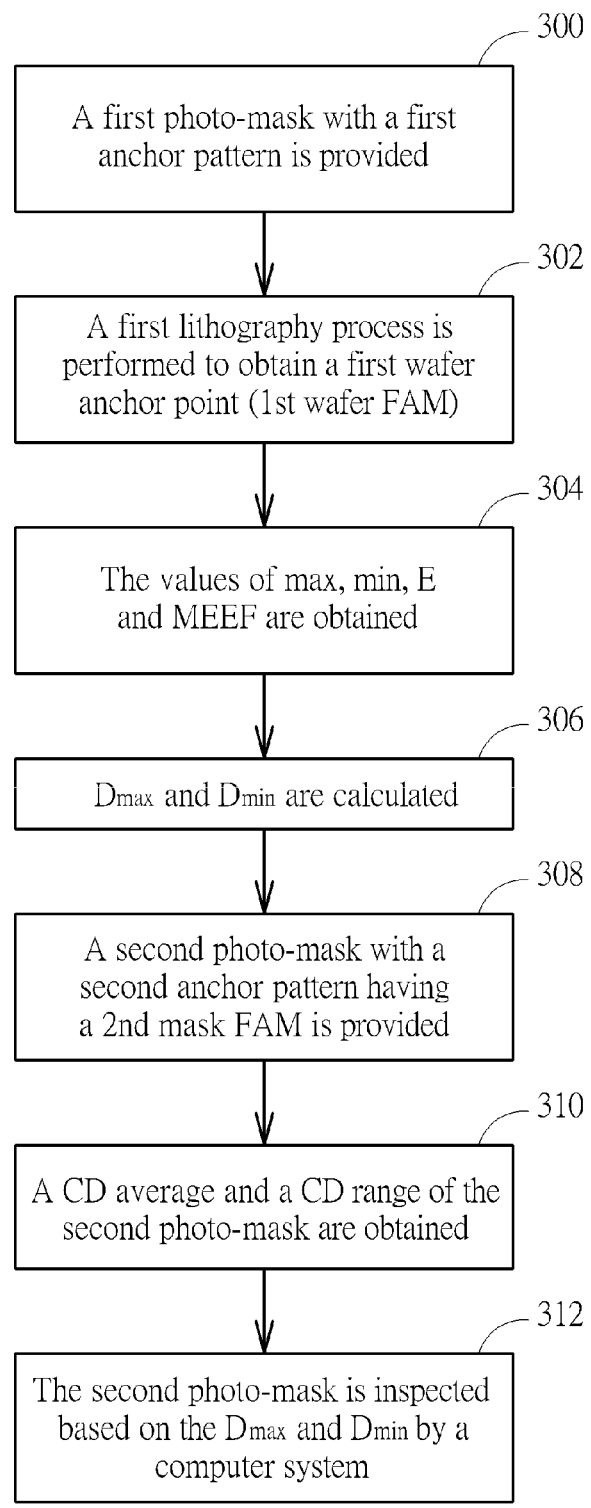
FIG. 1 illustrates a flow chart of an inspection method for a photo-mask of the present invention.
Figure 2:
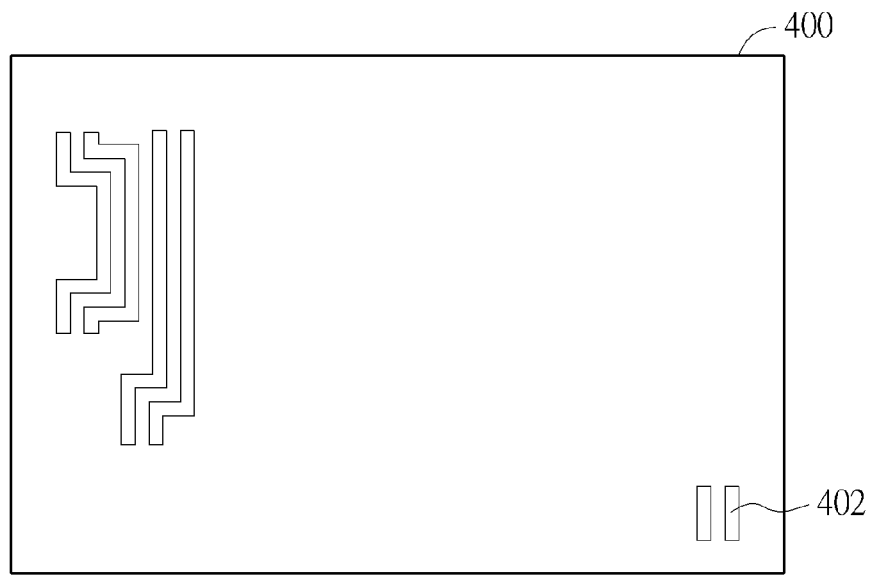
FIG. 2 shows a schematic diagram of the first photo-mask according to one embodiment of the present invention.

Please refer to FIG. 1, which illustrates a flow chart of an inspection method for a photo-mask in the present invention. As shown in FIG. 1, a first photo-mask with a first anchor pattern is provided (step 300). The first photo-mask preferably has been inspected and is a qualified photo-mask. Please refer to FIG. 2, which shows a schematic diagram of the first photo-mask according to one embodiment in the present invention. As shown in FIG. 2, the first photo-mask 400 can be of any kind of photo-masks that can serve as a photo-mask during a lithography process. In one embodiment, the first photo-mask 400 can be a binary intensity photo-mask (BIM) or a phase shift photo-mask (PSM). The first photo-mask 400 has an anchor pattern 402 with a line width called first mask anchor point (1st mask FAM).

Figure 3:
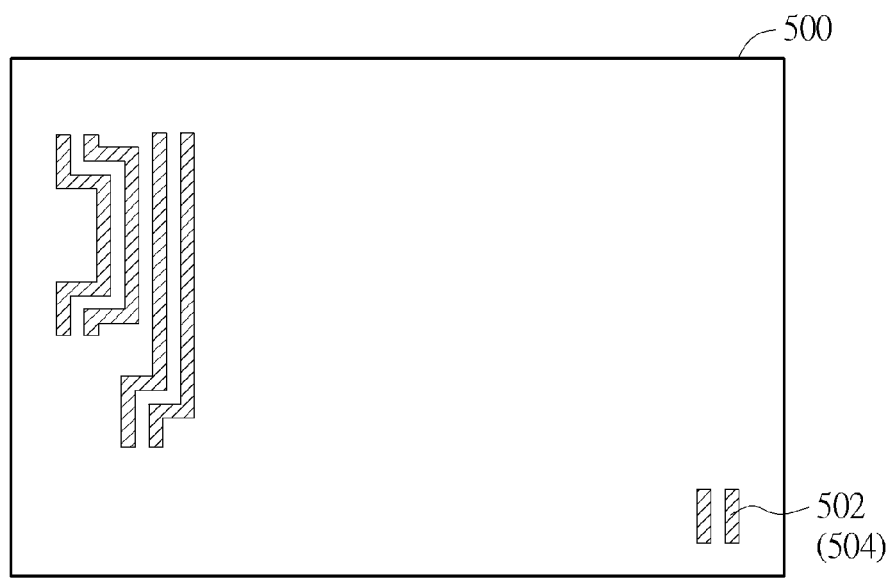
FIG. 3 shows a schematic diagram of obtaining the 1st wafer FAM according to one embodiment of the present invention.

Then, a first lithography process is performed to obtain a first wafer anchor point (1st wafer FAM) (step 302). In detail, as shown in FIG. 3 for example, a substrate 500 such as a semiconductor wafer is provided and a material layer, such as a photoresist layer, is formed on the substrate 500. Next, a lithography process using the first photo-mask as a photo-mask and a light source with a predetermined energy is performed to form a patterned material layer 504 on the substrate 502. The patterned material layer 504 has almost the same pattern as that in the first photo-mask 400 and includes a wafer anchor pattern 502, which corresponds to the anchor pattern 402. The CD of the wafer anchor pattern 504 is measured to obtain the first wafer anchor point (1st wafer FAM).

Figure 4:
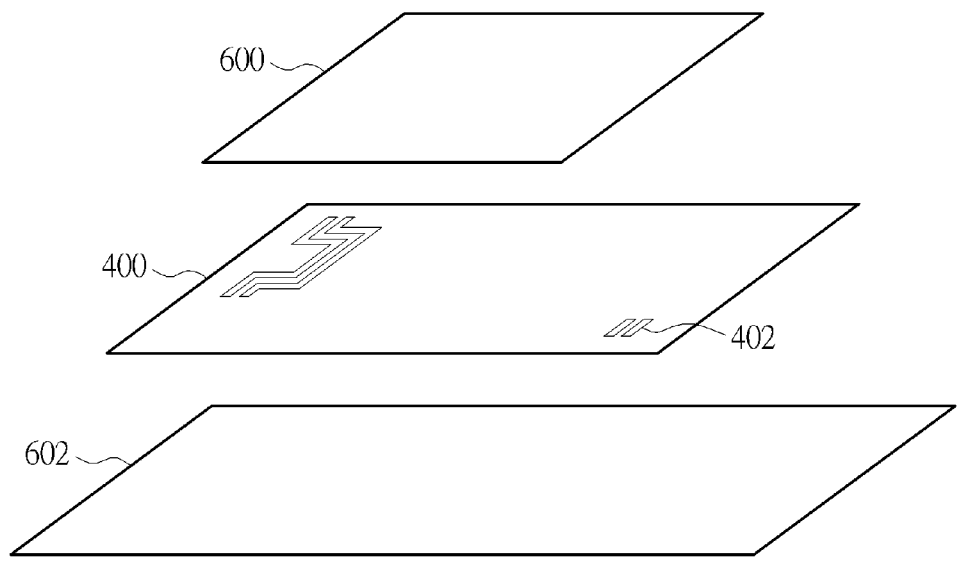
FIG. 4 shows a schematic diagram of obtaining the 1st wafer FAM according to another embodiment of the present invention.

In another embodiment, the 1st wafer FAM can be obtained by other methods. As shown in FIG. 4, the 1st wafer FAM can be directly captured by a sensor 602 by positioning the first photo-mask 400 under a light source 600 with that predetermined energy.

Besides, according to the semiconductor process, some parameters, such as a max accepted wafer factor (max), a min accepted wafer factor (min), an enlarged proportion value (E) and a mask error enhancement factor (MEEF) are obtained as well (step 304). The max accepted wafer factor corresponds to the maximum tolerance CD value of a wafer. If the pattern (for example, the patterned material layer 504) has a CD greater than the max accepted wafer factor, some defects such as bridging phenomenon may occur. The min accepted wafer factor corresponds to the minimum tolerance CD value of a wafer. If the pattern has a CD smaller than the min accepted wafer factor, some defects such as missing pattern may occur. The enlarged proportion value (E) means the enlarged ratio between the photo-mask pattern and the wafer pattern. The MEEF is a parameter used to reduce the pattern sensitivity to imaging errors.

In one embodiment, the max accepted wafer factor is about 45.5 nm, the min accepted wafer factor is 38.5 nm, the enlarged proportion value (E) is 4 and MEEF is 3.1. After measurement, the 1st wafer FAM is about 42 nm.

Then, the photo-mask CD tolerance, the max photo-mask error tolerance ($D_{max}$) and the min photo-mask error tolerance ($D_{min}$), are calculated (step 306) by converting the wafer CD tolerance to the photo-mask CD tolerance by a computer system. In the present invention, $D_{max}$ and $D_{min}$ are calculated by the following two equations:

$$D_{max} E*(\text{max}-\text{1st wafer } FAM)/MEEF \quad \text{(equation C)}$$

$$D_{min} = E*(\text{1st wafer } FAM-\text{min})/MEEF \quad \text{(equation D)}$$

$D_{max}$ and $D_{min}$ refer to the maximum tolerance CD value and the minimum tolerance CD value of a photo-mask that is used to perform in the same lithography process as for the first photo-mask. In one embodiment, according to the equation C, $D_{max}=4*(45.5-42)/3.1=4.5$, and according to the equation D, $D_{min}=4*(42-38.5)/3.1=4.5$.

Then, a second photo-mask with a second anchor pattern is provided (step 308). The second photo-mask is just made by the photo-mask manufacturer and is ready to be inspected. The second photo-mask, for example, contains a 2nd anchor pattern with a line width, which is the second mask anchor point (2nd mask FAM).

Figure 5:
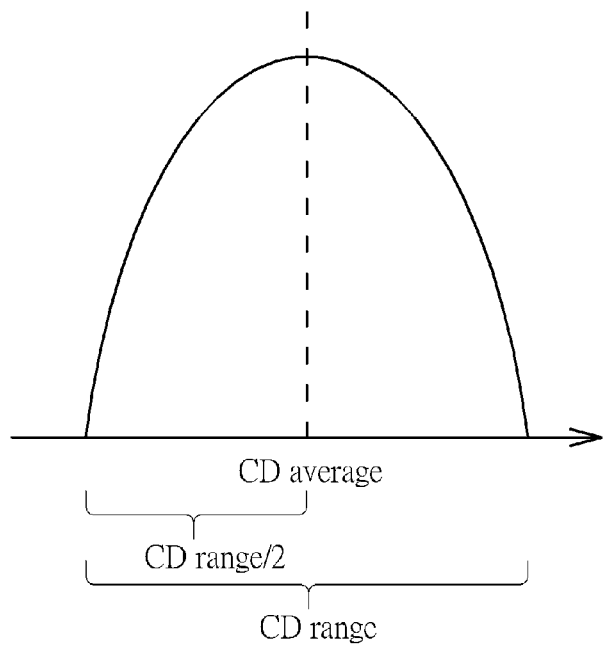
FIG. 5 illustrates a schematic diagram of the CD range and the CD average of the second photo-mask according to the present invention.

Next, a CD average and a CD range of the second photo-mask are obtained (step 310). Because the manufacturing method of the photo-mask is not stable, there might be a deviation between each point of CD. Consequently, a value of a CD average and a range of a CD of the second photo-mask are obtained by measuring N points of CD value on the second photo-mask. Please refer to FIG. 5, which illustrates a schematic diagram of the CD range and the CD average of the second photo-mask according to the present invention. As shown in FIG. 5, if N is large enough, for example, over 100, the CD average will be more precise and the range of CD will show a Gaussian distribution (also called "normal distribution"). In the embodiment, the Gaussian distribution is symmetrical wherein the CD average is positioned at the middle of the distribution and half of the CD range (CD range/2) will be at both sides of the distribution.

Figure 6:
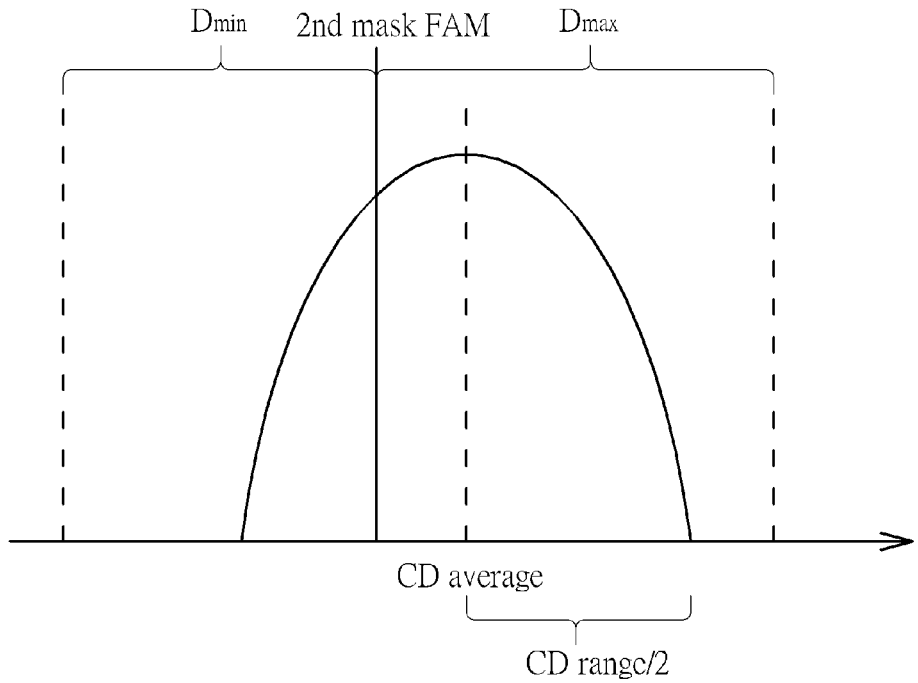
FIG. 6 shows a schematic diagram of the relationship between the CD range, the CD average and 2nd mask FAM, $D_{max}$ and $D_{min}$.
Figure 7:
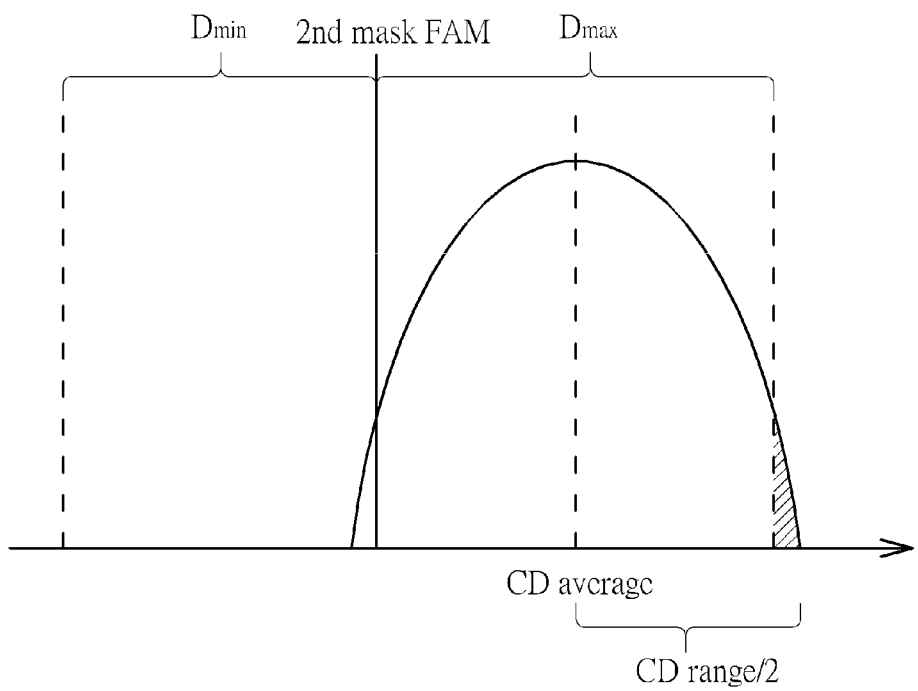
FIG. 7 and FIG. 8 are schematic diagrams showing that the CD range exceeds the tolerance value.
Figure 8:
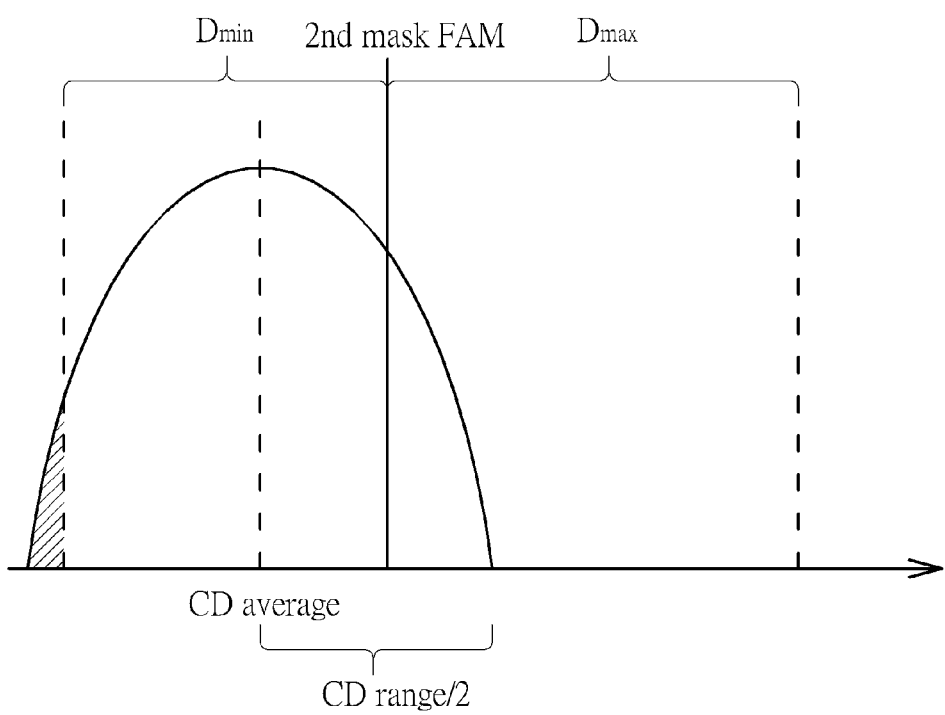

After getting the CD range, the CD average and the 2nd mask FAM of the second photo-mask, the second photo-mask can be inspected based on the $D_{max}$ and $D_{min}$ by a computer system (step 312). Please refer to FIG. 6, which shows a schematic diagram of the relationship between the CD range, the CD average and the 2nd mask FAM, $D_{max}$ and $D_{min}$. As shown in FIG. 6, the CD range of the second photo-mask should be within the acceptable value of the photo-mask CD, that is, between the interval of (2nd mask FAM+$D_{max}$) and (2nd mask FAM-$D_{min}$). If the CD range of the second photo-mask exceeds the $D_{max}$, as shown in FIG. 7, there will be a number of patterns formed by using the second photo-mask that are greater than the maximum wafer CD tolerance, causing the bridging phenomenon. If the CD range of the second photo-mask exceeds the $D_{min}$, as shown in FIG. 8, there will be a number of patterns having the CD smaller than the minimum wafer CD tolerance, causing the missing pattern phenomenon. Accordingly, for the max tolerance, as shown in FIG. 6, (CD average+CD range/2) is smaller than (2nd mask FAM+$D_{max}$), which can be presented by the following equation:

$$CD \text{ average}-\text{2nd mask } FAM<D_{max}-CD \text{ range}/2 \quad \text{(equation A)}$$

Similarly, for the min tolerance, (CD average−CD range/2) is greater than (2nd mask FAM−$D_{max}$), which can be presented by the following equation:

$$\text{2nd mask } FAM-CD \text{ average}<D_{min}-CD \text{ range}/2 \quad \text{(equation B)}$$

If the measured CD average and the CD range of the second photo-mask fits the equation A and the equation B, the second photo-mask is determined to be qualified to be used. On the contrary, if they do not fit the equation A or the equation B, the second photo-mask is determined to be unqualified and should be dismissed.

By using the inspection method provided in the present invention, only one photo-mask (the first photo-mask) is prepared to determine $D_{min}$ and $D_{max}$ by using the equations c and d, and the other to-be-inspected photo-masks (the second photo-mask for example) are checked by using the equations a and b involving $D_{min}$ and $D_{max}$. It is noted that the first photo-mask, which determines $D_{max}$ and $D_{min}$, and the to-be-inspected photo-masks are used for the same manufacturing process, so the lithography parameters of the first photo-mask can be used to inspect the second photo-mask. In one embodiment, the same predetermined energy of light source is used or the same material on the wafer is patterned. For example, another lithography process using a light source having the same fixed energy as the first lithography process is performed by using the second mask as a mask, so as to pattern the material layer.

The present invention can be specifically applied to wafer mass production, where a plurality of different photo-masks is used to perform many similar manufacturing processes, such as methods for forming a metal interconnection system. Once the first photo-mask has been used to determine the $D_{max}$ and the $D_{min}$, the other photo-masks, which are used to form metal lines, can be inspected in series before they are formally used to perform a lithography process. Since the unqualified photo-masks are not yet on the process line, the defects can be avoided and the yields can be enhanced.

In summary, the present invention provides an inspection method for a photo-mask, which concerns the CD average, the CD range and the mask FAM. The method is specifically beneficial since it can screen the unqualified photo-masks before they get on the process line.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An inspection method for a photo-mask in a semiconductor process, comprising:
    providing a first photo-mask with a first wafer anchor point (1st wafer FAM);
    calculating maximum photo-mask error tolerance ($D_{max}$) and minimum photo-mask error tolerance ($D_{min}$) according to the 1st wafer FAM;
    providing a second photo-mask with a second mask anchor point (2nd mask FAM);
    measuring a critical dimension (CD) average, and a CD range of the second photo-mask;
    inspecting the second photo-mask by using equation A and/or equation B by a computer system:

$$CD\ \text{average}-2\text{nd mask } FAM < D_{max} - CD\ \text{range}/2 \quad \text{(equation A)}$$

$$2\text{nd mask } FAM - CD\ \text{average} < D_{min} - CD\ \text{range}/2 \quad \text{(equation B);}$$

and
    wherein the $2^{nd}$ mask FAM, the CD average, and CD range do not match equation A and/or equation B, the second photo-mask is dismissed.

2. The method for inspecting a photo-mask in a semiconductor process as in claim 1, wherein the 1st wafer FAM is obtained by using a light source with a fixed energy and using the first photo-mask as a photo-mask.

3. The method for inspecting a photo-mask in a semiconductor process as in claim 2, further comprising performing a lithography process by using the second photo-mask as a photo-mask, wherein the lithography process uses a light source having said fixed energy.

4. The method for inspecting a photo-mask in a semiconductor process as in claim 1, wherein a max accepted wafer factor (max), a min accepted wafer factor (min), an enlarged proportion value (E) and a photo-mask error effective factor (MEEF) are provided according to the semiconductor process.

5. The method for inspecting a photo-mask in a semiconductor process as in claim 4, wherein $D_{max}$ and $D_{min}$ are calculated by equation C and equation D:

$$D_{max} = E^*(\text{max} - 1\text{st wafer } FAM)/MEEF \quad \text{(equation C)}$$

$$D_{min} = E^*(1\text{st wafer } FAM - \text{min})/MEEF \quad \text{(equation D).}$$

6. The method for inspecting a photo-mask in a semiconductor process as in claim 1, wherein the step of measuring the CD average and the CD range is performed by measuring N points of CD on the second photo-mask, and N is an integer greater than 100.

* * * * *